(12) United States Patent
Jiang et al.

(10) Patent No.: US 12,713,731 B2
(45) Date of Patent: Aug. 18, 2026

(54) SOLAR CELL AND PREPARATION METHOD THEREFOR

(71) Applicant: TONGWEI SOLAR (MEISHAN) CO., LTD., Meishan (CN)

(72) Inventors: Yangxu Jiang, Meishan (CN); Xiupeng Wang, Meishan (CN); Guoqiang Xing, Meishan (CN)

(73) Assignee: TONGWEI SOLAR (MEISHAN) CO., LTD., Meishan (CN)

( * ) Notice: Subject to any disclaimer, the term of this patent is extended or adjusted under 35 U.S.C. 154(b) by 0 days.

(21) Appl. No.: 18/697,313

(22) PCT Filed: Oct. 26, 2022

(86) PCT No.: PCT/CN2022/127748
§ 371 (c)(1),
(2) Date: Mar. 29, 2024

(87) PCT Pub. No.: WO2023/184955
PCT Pub. Date: Oct. 5, 2023

(65) Prior Publication Data

US 2024/0395964 A1 Nov. 28, 2024

(30) Foreign Application Priority Data

Mar. 29, 2022 (CN) ......................... 202210323823.2

(51) Int. Cl.
*H10F 71/00* (2025.01)
*H10F 77/164* (2025.01)
*H10F 77/30* (2025.01)

(52) U.S. Cl.
CPC ....... *H10F 71/129* (2025.01); *H10F 71/1221* (2025.01); *H10F 71/128* (2025.01); *H10F 77/1642* (2025.01); *H10F 77/315* (2025.01)

(58) Field of Classification Search
CPC .. H10F 71/121; H10F 71/1221; H10F 71/128; H10F 71/129; H10F 77/1642; H10F 77/211; H10F 77/315
See application file for complete search history.

(56) References Cited

U.S. PATENT DOCUMENTS

2013/0105806 A1* 5/2013 Liu ....................... H10F 77/122
257/E21.318

FOREIGN PATENT DOCUMENTS

CN 104752562 A 7/2015
CN 106229360 A 12/2016
(Continued)

OTHER PUBLICATIONS

CN 112490304 A English Translation provided by FIT database.*
(Continued)

*Primary Examiner* — Golam Mowla
(74) *Attorney, Agent, or Firm* — Dority & Manning, PA

(57) ABSTRACT

In one aspect, a method for preparing a solar cell includes: forming a selective emitter on a front side of the solar cell, the selective emitter including first and second doped regions, and a P-type doping concentration of the first doped region being greater than that of the second doped region; and bringing a positive electrode of the solar cell to be in electrical contact with the first doped region. The disclosed method can effectively improve a filling factor of the solar cell while ensuring a lower Auger recombination and improving an open circuit voltage and a short-circuit current such that the solar cell has higher conversion efficiency.

10 Claims, 1 Drawing Sheet

(56) References Cited

FOREIGN PATENT DOCUMENTS

| | | | |
|---|---|---|---|
| CN | 110299422 | A | 10/2019 |
| CN | 111739985 | A | 10/2020 |
| CN | 112117334 | A | 12/2020 |
| CN | 112490304 | A | 3/2021 |
| CN | 112670353 | A | 4/2021 |
| CN | 113035976 | A | 6/2021 |
| CN | 113707761 | A | 11/2021 |
| CN | 113809205 | A | 12/2021 |
| CN | 113972130 | A | 1/2022 |
| CN | 114639744 | A | 6/2022 |
| CN | 115483298 | A | 12/2022 |
| JP | 2014197578 | A | 10/2014 |
| KR | 1020100073645 | A | 7/2010 |

OTHER PUBLICATIONS

CN 112117334 A English Translation provided by FIT database.*
CN 113809205 A English Translation provided by FIT database.*
Office Action received in corresponding Application No. AU 2022449708, dated May 28, 2025, 5 pages.
International Search Report and Written Opinion (with English translation) received in corresponding Application No. PCT/CN2022/127748, dated Jan. 11, 2023, 14 pages.
Office Action received in corresponding Application No. CN 202210323823.2, dated Feb. 8, 2023, 6 pages.
Office Action (with English translation) received in corresponding Application No. 202210323823.2, dated Apr. 17, 2023, 10 pages.
Chinese Search Report for corresponding Application No. 2022103238232, dated Feb. 6, 2023, 3 pages.
Extended European Search Report for corresponding Application No. 22934773.7, dated Oct. 30, 2024, 9 pages.

* cited by examiner

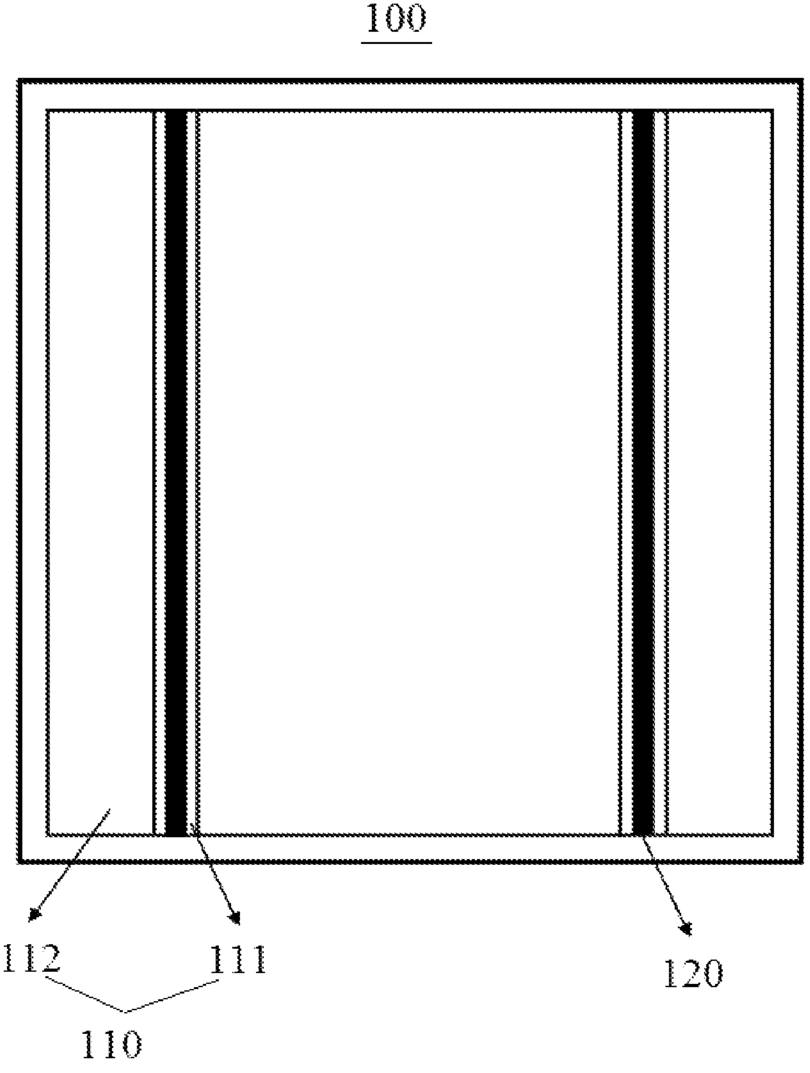
100
112
111
120
110

SOLAR CELL AND PREPARATION METHOD THEREFOR

CROSS-REFERENCE TO RELATED APPLICATIONS

This application is a U.S. national phase application under 35 U.S.C. § 371 based upon International Patent Application No. PCT/CN2022/127748, filed on Oct. 26, 2022, which itself claims priority to Chinese Patent Application No. 202210323823.2, filed on Mar. 29, 2022 with China National Intellectual Property Administration, entitled "SOLAR CELL AND PREPARATION METHOD THEREFOR", the content of which is hereby incorporated by reference in its entirety.

TECHNICAL FIELD

The present disclosure relates to the technical field of photovoltaics, and in particular, to a solar cell and a method for preparing a solar cell.

BACKGROUND

In recent years, a solar cell such as an N-type tunnel oxide passivating contact (TOPCon) cell is favored because of excellent passivation performance of the solar cell. In a traditional process of solar cells such as a TOPCon cell, to reduce an Auger combination and improve an open voltage and a short current, a finished cell product usually has a relatively high square resistance. However, a filler factor is affected by a relatively high square resistance, leading to reduce a conversion efficiency of the cell.

SUMMARY

The present disclosure provides a solar cell and a preparation method thereof, it can effectively improve a filling factor of the solar cell while ensuring a lower Auger recombination and improving an open circuit voltage and a short-circuit current, such that the solar cell has higher conversion efficiency.

The embodiments of the present disclosure are implemented as below.

The present disclosure provides a method for preparing a solar cell. The method includes: forming a selective emitter on a front side of the solar cell, wherein the selective emitter includes a first doped region and a second doped region, and a P-type doping concentration of the first doped region is greater than a P-type doping concentration of the second doped region; and bringing a positive electrode of the solar cell to be in electrical contact with the first doped region.

In some optional embodiments, a step of forming the selective emitter on the front side of the solar cell includes:

- providing an N-type silicon wafer having a P-N junction;
- printing a boron slurry on a front side of the silicon wafer; and
- pushing the boron slurry from a preset area of the front side of the silicon wafer to a P-type doping area of the front side of the silicon wafer to form the first doped region, and taking a remaining region of the P-type doping area as the second doped region.

In some optional embodiments, the preset area on the front side of the silicon wafer is configured for forming the positive electrode.

In some optional embodiments, a mass concentration of the boron slurry is in a range of 2.5% to 7%.

In some optional embodiments, a step of forming the selective emitter on the front side of the solar cell further includes:

- before printing the boron slurry on the front side of the silicon wafer, removing a boron-silicon glass on the front side of the silicon wafer.

In some optional embodiments, a step of forming the first doped region further includes pushing the boron slurry by a laser,

- wherein, optionally, a laser power is in a range of 20 W to 40 W, a percentage of an output power of laser is in a range of 70% to 90%, a laser scanning speed is in a range of 20 m/s to 30 m/s, and the number of a laser scanning times is in a range of 2 to 4.

In some optional embodiments, the step of forming the first doped region further includes pushing the boron slurry by the laser, which is emitted by a nanosecond laser device.

In some optional embodiments, the step of forming the selective emitter on the front side of the solar cell further includes: forming another boron-silicon glass on the front side of the silicon wafer again after forming the first doped region; and

- wherein, optionally, a process of reforming the boron-silicon glass includes: first depositing a silicon oxide layer with a thickness in a range of 50 nm to 100 nm, and then heating for 30 min to 60 min at a temperature of 900° C. to 1300° C.

In some optional embodiments, a step of printing the boron slurry on the front side of the silicon wafer includes: printing the boron slurry on an entire front side of the silicon wafer, and a step of forming the first doped region includes: printing the boron slurry on the preset area of the front side of the silicon wafer.

In some optional embodiments, after a step of forming the selective emitter on the front side of the solar cell, the method further includes the following steps in sequence:

- removing a boron-silicon glass on the back side of the silicon wafer, the P-N junction on a back side and an edge of the silicon wafer, and remaining boron slurry on the front side of the silicon wafer; and
- disposing a doped oxide layer and an amorphous silicon passivation film on the back side of the silicon wafer; and
- annealing to make a crystal structure of the amorphous silicon passivation film change to form a polycrystalline silicon thin film;
- removing an oxide layer on the front side of the silicon wafer formed in a process of disposing the doped oxide layer and an oxide layer formed in a process of annealing, and removing amorphous silicon on the front side of the silicon wafer formed in a process of disposing the amorphous silicon passivation film; and
- forming a front passivation film and a front reflection reducing film on the front side of the silicon wafer, and forming a back hydrogen passivation film on the back side of the silicon wafer; and
- forming electrodes.

In some optional embodiments, the first doped region is a heavy doped region, and the second doped region is a light doped region.

In some optional embodiments, the method further includes a step of preparing a functional structure, wherein the functional structure is at least one of an anti-reflection textured structure, a P-N junction, a tunneling oxide layer, a polycrystalline silicon film, a front anti-reflection film, or a back hydrogen passivation film.

The present disclosure further provides a solar cell, wherein a front side of the solar cell has a selective emitter and a positive electrode; the selective emitter includes a first doped region and a second doped region, and a P-type doping concentration of the first doped region is greater than a P-type doping concentration of the second doped region; and the positive electrode is in electrical contact with the first doped region.

In some optional embodiments, the solar cell is a TOPCon cell.

In some optional embodiments, the TOPCon cell includes a negative electrode, a back hydrogen passivation film, a polycrystalline silicon film, a doped oxide layer, an N-type silicon wafer, a selective emitter 110, a front passivation film, a front anti-reflection film, and a positive electrode stacked in order.

The solar cell and the preparation method thereof in the present disclosure have following advantages:

the selective emitter is formed on the front side of the solar cell. A first doped region with a relatively high P-type doping concentration is in contact with the positive electrode, so that a contact resistance can be reduced, and a filling factor can be effectively improved. A second doped region with a relatively high P-type doping concentration is distributed between positive electrodes, so as to ensure a lower Auger recombination and improve an open circuit voltage and a short-circuit current.

Therefore, the solar cell in the present disclosure has relatively high conversion efficiency while ensuring lower performance of Auger recombination and higher performance of an open circuit voltage, a short-circuit current, and a fill factor.

BRIEF DESCRIPTION OF THE DRAWINGS

To describe the technical solutions of the embodiments of present disclosure more clearly, the following briefly describes the accompanying drawings required for describing the embodiments. It should be understood that the following accompanying drawings show only some embodiments of the present disclosure. Therefore, the accompanying drawings should not be considered as a limitation on a scope. A person of ordinary skill in the art may still derive other related drawings from these accompanying drawings without creative efforts.

FIG. 1 is a schematic structural diagram of a solar cell according to an embodiment of the present disclosure.

Reference signs: 100 represents a solar cell, 110 represents a selective emitter, 111 represents a first doped region, 112 represents a second doped region, and 120 represents a positive electrode.

DETAILED DESCRIPTION

To make the objectives, technical solutions, and advantages of the embodiments of the present disclosure clearer, the following clearly and completely describes the technical solutions in the embodiments of the present disclosure. If a specific condition is not specified in the embodiment, the condition is performed according to the conventional condition or the condition recommended by the manufacturer. If the reagent or instrument used is not specified by the manufacturer, it is a regular product available for commercial purchase.

It should be noted that, in the description of the present disclosure, unless otherwise noted, "multiple" in "one or more" means two or more: the range of "value a to value b" includes the values "a" and "b" at both ends. The "unit of measure" in "value a to value b and unit of measure" represents the "unit of measure" of "value a" and "value b".

The solar cell and the preparation method thereof in the embodiments of the present disclosure will be described as following.

It is found that in the current TOPCon cell, entire side of the cell is a light doped emitter, so that the Auger recombination can be reduced and an open circuit voltage and a short-circuit current can be improved. However, in this way, a square resistance is relatively high, resulting in that a positive electrode and an emitter have a relatively high contact resistance, further reducing a filling factor of a cell, thereby affecting conversion efficiency of the cell.

Based on the foregoing research, some embodiments of the present disclosure provide a method for preparing a solar cell, which includes: forming a selective emitter on a front side of the solar cell.

The selective emitter includes a first doped region and a second doped region, and a P-type doping concentration of the first doped region is greater than a P-type doping concentration of the second doped region. A positive electrode of the solar cell is in electrical contact with the first doped region, that is, the second doped region is an area of the selective emitter that is located between the positive electrodes.

The P-type doping concentration refers to a concentration of P-type doping particles, and represents a degree of P-type doping in a corresponding doped region.

In the present disclosure, the selective emitter is formed on the front side of the solar cell. The first doped region with a relatively high P-type doping concentration is provided, and the first doped region is in contact with the positive electrode, so that a contact resistance can be reduced, and a filling factor can be effectively improved. The second doped region with a relatively high P-type doping concentration is provided, and the second doped region is located between positive electrodes, so as to ensure that the Auger recombination is relatively lowered and an on voltage and a short-circuit current are improved.

Therefore, the solar cell in the present disclosure has relatively high conversion efficiency while ensuring lower performance of Auger recombination and higher performance of an open circuit voltage, a short-circuit current, and a fill factor.

Optionally, the first doped region is a heavy doped region, and the second doped region is a light doped region.

In some embodiments, the second doped region is a doped region formed by boron diffusion, and the first doped region is a doped region formed by first boron diffusion and then pushing boron slurry into a boron diffusion area.

In an embodiment, to prepare a selective emitter that uses a heavy doped region as the first doped region and a light doped region as the second doped region, a step of forming the selective emitter on the front side of a solar cell includes: providing an N-type silicon wafer having a P-N junction: printing a boron slurry on a front side of the silicon wafer; and pushing the boron slurry from a preset area of the front side of the silicon wafer to a P-type doping area of the front side of the silicon wafer to form the first doped region, and taking a remaining part of the P-type doping area as the second doped region.

The preset area on the front side of the silicon wafer may be determined according to a screen, and an area on the front side of the silicon wafer that is used to form the positive electrode is selected as the preset area. That is, the preset area on the front side of the silicon wafer is configured for forming the positive electrode.

Optionally, a boron mass concentration of the boron slurry is in a range of 2.5% to 7%, for example, but is not limited to 2.5%, 3%, 3.5%, 4%, 4.5%, 5%, 5.5%, 6%, 6.5% and 7% or any value in the range of 2.5% to 7%.

The boron mass concentration of the boron slurry can be controlled in the range of 2.5% to 7%, so that the first doped region regarded as the heavy doped region has a proper P-type doping concentration, and a contact resistance between the selective emitter and the positive electrode can be more reliably reduced, thereby improving a filling factor greatly.

It is found that the N-type silicon wafer forms a boron-silicon glass on a surface of the silicon wafer when a P-N junction is formed by boron diffusion. However, the existence of the boron-silicon glass will obstacle a process of pushing the boron slurry to the P-type doping area on the front side of the silicon wafer, and therefore requires high energy to push the boron slurry to the P-type doping area on the front side of the silicon wafer.

Optionally, the step of forming the selective emitter on the front side of the solar cell may further includes: before printing the boron slurry on the front side of the silicon wafer, removing a boron-silicon glass on the front side of the silicon wafer.

The boron-silicon glass on a front side of the silicon wafer is first removed, and then boron slurry is printed on the front side of the silicon wafer, so that the boron-silicon glass on the front side does not affect a process of pushing the boron slurry to the P-type doping area of the front side of the silicon wafer. Therefore, the boron slurry can be pushed into a P-type doping area on the front side of the silicon wafer with very low energy.

In an embodiment, in which the boron-silicon glass is first removed and then boron slurry is printed, a step of forming the first doped region further includes pushing the boron slurry by a laser for conveniently performing. That is, the boron slurry is pushed through the laser from a preset area of the front side of the silicon wafer to the P-type doping area of the front side of the silicon wafer to form the first doped region.

Furthermore, a nanosecond laser device is used for pushing the boron slurry.

To ensure a better pushing effect, parameters of a laser pushing process are set as below:

- a laser power is in a range of 20 W to 40 W, for example, but is not limited to 20 W, 30 W, and 40 W or any value in the range of 20 W to 40 W;
- a percentage of an output power of laser is in a range of 70% to 90%, for example, but is not limited to 70%, 80%, and 90% or any value in the range of 70% to 90%;
- a laser scanning speed is in a range of 20 m/s to 30 m/s, for example, but is not limited to 20 m/s, 25 m/s, and 30 m/s or any value in the range of 20 m/s to 30 m/s; and
- the number of a laser scanning times is in a range of 2 to 4, for example, 2, 3, or 4.

It found that if the boron slurry is printed only in a preset area, when the boron slurry is pushed forward, a problem that a boron slurry line is inconsistent with a laser line and a positive electrode is occurred, thereby affecting location accuracy of the first doped region, and further affecting a function of reducing a contact resistance by the first doped region.

Optionally, when the boron slurry is printed on the front side of the silicon wafer, the boron slurry is printed on the entire front side of the silicon wafer. When the first doped region is formed, a part of a printing area on the front side of the silicon wafer in which the boron slurry is printed is selected as the preset area, that is, a part of an entire boron slurry printing surface is selected as the preset area.

It may be understood that, because a remaining portion of the boron slurry of the boron slurry printing surface remains on the front side of the silicon wafer, the method further includes removing the remaining portion of the boron slurry, that is, the boron slurry corresponding to the second doped region is removed.

In an embodiment, in which the boron-silicon glass is first removed and then boron slurry is printed, a step of forming the selective emitter on the front side of the solar cell further includes: forming another boron-silicon glass on the front side of the silicon wafer again after forming the first doped region, that is, after pushing the boron slurry from a preset area of the front side of the silicon wafer to the P-type doping area of the front side of the silicon wafer to form the first doped region, another boron-silicon glass is reformed on the surface of the selective emitter again.

The method further includes performing an RCA cleaning operation after forming the selective emitter. After the selective emitter is formed, the boron-silicon glass formed again can effectively prevent from destroying the front side of the solar cell in an RCA cleaning operation, so that it can effectively protect a structure such as the selective emitter on the front side of the solar cell.

Optionally, a process of forming the another boron-silicon glass may include: first depositing a silicon oxide layer with a thickness in a range of 50 nm to 100 nm, and then heating for 30 min to 60 min at a temperature of 900° C. to 1300° C.

For example, a thickness of the silicon oxide layer can be, but is not limited to, 50 nm, 60 nm, 70 nm, 80 nm, 90 nm, and 100 nm, or a value in the range of 50 nm to 100 nm.

A temperature of heating can be, but is not limited to, 900° C., 1000° C., 1100° C., 1200° C., 1300° C., or a value in the range of 900° C. to 1300° C.

A time of heating can be, but is not limited to, 30 min, 40 min, 50 min, 60 min, or a value in the range of 30 min to 60 min.

In the method for preparing the solar cell in the present disclosure, a step of preparing a functional structure may be added as required. For example, the functional structure is, but is not limited to, at least one of an anti-reflection textured structure, a P-N junction, a tunneling oxide layer, a polycrystalline silicon film, a front anti-reflection film, or a back hydrogen passivation film.

In an embodiment, a method for preparing a TOPCon cell includes following steps in sequence after the step of forming the selective emitter on the front side of the solar cell:

- removing a boron-silicon glass on the back side of the silicon wafer, the P-N junction on a back side and an edge of the silicon wafer, and remaining boron slurry on the front side of the silicon wafer: disposing a doped oxide layer and an amorphous silicon passivation film on the back side of the silicon wafer: annealing to make a crystal structure of the amorphous silicon passivation film change to form a polycrystalline silicon thin film: removing an oxide layer on the front side of the silicon wafer formed in a process of disposing the doped oxide layer and an oxide layer formed in a process of annealing, and removing amorphous silicon on the front side of the silicon wafer formed in a process of disposing the amorphous silicon passivation film: forming a front passivation film and a front reflection reducing film on the front side of the silicon wafer, and forming a back hydrogen passivation film on the back side of the silicon wafer; and forming electrodes.

It may be understood that a step of forming electrodes includes forming a positive electrode and a negative electrode. When forming the positive electrode, the positive electrode is in electrical contact with the first doped region, and the second doped region is located between the positive electrodes.

The method for preparing the solar cell in the present disclosure has following advantages:

1. The selective emitter is formed on the front side of the solar cell, thus the solar cell in the present disclosure has relatively high conversion efficiency while ensuring lower performance of Auger recombination and higher performance of an open circuit voltage, a short-circuit current, and a fill factor.
2. The boron-silicon glass on the front side of the silicon wafer is first removed, then the boron slurry is printed on the front side of the silicon wafer. In this way, the boron slurry can be pushed to the P-type doping area of the front side of the silicon wafer using very low energy.
3. In a process of printing the boron slurry on the front side of the silicon wafer, the boron slurry is printed on the entire front side of the silicon wafer, so that when the boron slurry is pushed, a problem that a boron slurry line is inconsistent with a laser line and the positive electrode is effectively avoided.

Referring to FIG. 1, another embodiment of the present disclosure provides a solar cell 100, which can be prepared by using the above method.

A front side of the solar cell 100 has a selective emitter 110 and a positive electrode 120.

The selective emitter 110 may include a first doped region 111 and a second doped region 112, and a P-type doping concentration of the first doped region 111 is greater than a P-type doping concentration of the second doped region 112. The positive electrode 120 is in electrical contact with the first doped region 111.

A boron slurry is printed on the entire front side of the silicon wafer, and an entire surface of the printed boron slurry is an entire area corresponding to the first doped region 111 and the second doped region 112 shown in FIG. 1.

Taking a TOPCon cell as an example, the TOPCon cell may include a negative electrode, a back hydrogen passivation film, a polycrystalline silicon film, a doped oxide layer, an N-type silicon wafer, a selective emitter 110, a front passivation film, a front anti-reflection film, and a positive electrode stacked in order.

The features and performance of the present disclosure are further described in detail below with reference to the examples.

Example 1

A method for preparing a solar cell includes:

(1) texturing: preparing an N-type silicon wafer, texturing the silicon wafer by an alkaline liquid with a concentration of 1% by mass and cleaning the silicon wafer by a hydrogen peroxide solution and an alkaline liquid;

(2) boron diffusion: putting the silicon wafer into a tube-type boron diffusion furnace and achieving boron diffusion by introducing $BCl_3$ at a high temperature, to form a light doping PN junction;

(3) removing BSG: removing BSG formed on a front side of the silicon wafer using a chain HF machine;

(4) printing a boron slurry: using a screen printer to print a boron slurry with a mass concentration of 7% on an entire front side of the silicon wafer, and then using a chain oxygen printer to dry the boron slurry for 6 minutes at 80° C.;

(5) pushing boron slurry by laser: an area corresponding to a positive electrode in a boron slurry printing area is regarded as a preset area, and boron slurry in the preset area is pushed using a nanosecond laser device and boron under laser propulsion is performed to form a selective emitter. In the selective emitter, a region corresponding to boron under laser propulsion is defined as a first doped region, and a region in which boron under laser propulsion is not performed is a second doped region, wherein a laser power is 30 W, a percentage of an output power of laser is 70%, a laser scanning speed is 30 m/s, and the number of a laser scanning times is 2;

(6) thermal oxidation: first, depositing a silicon oxide layer with a thickness of 100 nm using PECVD, and performing thermal oxidation for 30 min at 900° C. in a tube diffusion furnace to form BSG on the front side of the silicon wafer;

(7) alkaline pickling: removing wraparound BSG formed in the boron diffusion from the back side of the silicon wafer using a chain HF machine, and then using a slot-type alkali pickling machine to remove P-N junctions on the back side and edge of the silicon wafer and the boron slurry corresponding to light doping region on the front side of the silicon wafer;

(8) forming a doping oxide layer and an amorphous silicon passivation film on the back side of the silicon wafer: performing a thin film deposition on the back side of the silicon wafer using a tube-type PECVD device;

(9) annealing: a crystal structure of the amorphous silicon passivation film changing in a tubular annealing furnace by using nitrogen or oxygen, and forming a polycrystalline silicon film;

(10) RCA cleaning: using a chain HF machine to remove wraparound oxide layer on the front side of the silicon wafer during the deposition of step (8) and an oxide layer formed during annealing, and then using a slot-type alkali pickling machine to remove wraparound amorphous silicon deposited on the front side of the silicon wafer;

(11) depositing an aluminum oxide film and the silicon nitride film on the front side of the silicon wafer: depositing an aluminum oxide ($AlO_x$) film in a PEALD manner or a PECVD manner for passivation, and an silicon nitride ($SiN_x$) film in a PECVD manner for anti-reflection;

(12) depositing a silicon nitride film on the back side by PECVD: depositing a $SiN_x$ film by PECVD and the $SiN_x$ film being used for hydrogen passivation on the back side;

(13) screen-printing a slurry on the front side and the back side of the silicon wafer to form electrodes, wherein the positive electrode is in electrical contact with the first doped region; and

(14) electric injection, testing a conversion efficiency and sorting.

Example 2

A method for preparing a solar cell in Example 2 is substantially the same as that of the method in Example 1, the difference is in that:

in step (4), a mass concentration of a boron slurry is 2.5%; and in step (5), a percentage of an output power of laser is 90% and the number of a laser scanning times is 4.

Example 3

A method for preparing a solar cell in Example 3 is substantially the same as that of the method in Example 1, the difference is in that:

in step (5), a laser scanning speed is 20 m/s and the number of a laser scanning times is 4.

Example 4

A method for preparing a solar cell in Example 4 is substantially the same as that of the method in Example 1, the difference is in that:

in step (6), depositing a silicon oxide layer with a thickness of 50 nm, and performing thermal oxidation for 30 min at 900° C.

Example 5

A method for preparing a solar cell in Example 5 is substantially the same as that of the method in Example 1, the difference is in that:

in step (6), depositing a silicon oxide layer with a thickness of 50 nm, and performing thermal oxidation for 30 min at 1300° C.

Example 6

A method for preparing a solar cell in Example 6 is substantially the same as that of the method in Example 1, the difference is in that:

in step (6), depositing a silicon oxide layer with a thickness of 50 nm, and performing thermal oxidation for 60 min at 1300° C.

Comparative Example 1

A method for preparing a solar cell includes:

(1) texturing: preparing an N-type silicon wafer, texturing the silicon wafer by an alkaline liquid with a concentration of 1% by mass and cleaning the silicon wafer by a hydrogen peroxide solution and an alkaline liquid;

(2) boron diffusion: putting the silicon wafer into a tube-type boron diffusion furnace and achieving boron diffusion by introducing $BCl_3$ at a high temperature, to form a light doping PN junction;

(3) alkaline pickling: removing wraparound BSG formed in the boron diffusion from the back side of the silicon wafer using a chain HF machine, and then using a slot-type alkali pickling machine to remove P-N junctions on the back side and edge of the silicon wafer;

(4) forming a doping oxide layer and an amorphous silicon passivation film on the back side of the silicon wafer: performing a thin film deposition on the back side of the silicon wafer using a tube-type PECVD device;

(5) annealing: a crystal structure of the amorphous silicon passivation film changing in a tubular annealing furnace by using nitrogen or oxygen, and forming a polycrystalline silicon film;

(6) RCA cleaning: using a chain HF machine to remove wraparound oxide layer on the front side of the silicon wafer during the deposition of step (4) and an oxide layer formed during annealing, and then using a slot-type alkali pickling machine to remove wraparound amorphous silicon deposited on the front side of the silicon wafer;

(7) depositing an aluminum oxide film and the silicon nitride film on the front side of the silicon wafer: depositing an aluminum oxide ($AlO_x$) film in a PEALD manner or a PECVD manner for passivation, and an silicon nitride ($SiN_x$) film in a PECVD manner for anti-reflection;

(8) depositing a silicon nitride film on the back side by PECVD: depositing a $SiN_x$ film by PECVD and the $SiN_x$ film being used for hydrogen passivation on the back side;

(9) screen-printing a slurry on the front side and the back side of the silicon wafer to form electrodes, wherein the positive electrode is in electrical contact with the first doped region; and

(14) electrical injection, testing a conversion efficiency and sorting.

Test

The obtained solar cells of examples and comparative example are tested for electrical performance.

1. According to a test result, the solar cells obtained in Example 1 to Example 6 have better performance in terms of Auger recombination, an open circuit voltage, a short-circuit current, a fill factor, and a conversion efficiency.
2. The electrical performance test results of the solar cells obtained in Example 1 and Comparative Example 1 are shown in Table 1.

TABLE 1

Electrical performance test results of solar cells

| Project | Eta (%) | Voc (V) | Isc (A) | FF (%) |
|---|---|---|---|---|
| Example 1 | 24.75 | 0.7226 | 18.162 | 83.16 |
| Comparative Example 1 | 24.56 | 0.7192 | 18.151 | 82.96 |

Eta represents an Auger recombination, Voc represents an open circuit voltage, Isc represents a short-circuit current, and FF represents a fill factor.

According to Example 1, Comparative Example 1, and Table 1, it is shown that:

A difference of Example 1 and Comparative Example 1 is in that, Example 1 includes steps (3) to (6).

From an electrical performance of the solar cell obtained, in a case in which Auger recombination of Example 1 is equivalent to that of Comparative Example 1, the open circuit voltage, the short-circuit current, and the fill factor in Example 1 are improved.

The foregoing described embodiments are some rather than all embodiments of the present disclosure. The detailed description of the embodiments of the present disclosure is not intended to limit the scope of the application, but merely represents the selected embodiments of the present disclosure. Based on the embodiments of the present disclosure, all other embodiments obtained by a person of ordinary skill in the art without creative efforts fall within the protection scope of the present disclosure.

INDUSTRIAL PRACTICALITY

The present disclosure provides a solar cell and a preparation method thereof, related to the field of photovoltaic technologies. A method for preparing a solar cell includes: forming a selective emitter on a front side of the solar cell, wherein the selective emitter includes a first doped region and a second doped region, and a P-type doping concentration of the first doped region is greater than a P-type doping concentration of the second doped region; and bringing a positive electrode of the solar cell to be in electrical contact with the first doped region. A front side of the solar cell has a selective emitter and a positive electrode: the selective emitter includes a first doped region and a second doped region, and a P-type doping concentration of the first doped region is greater than a P-type doping concentration of the second doped region; and the positive electrode is in electrical contact with the first doped region. The solar cell can effectively improve a filling factor, so that the battery has relatively high conversion efficiency, while ensuring that an Auger recombination is relatively low and an open circuit voltage and a short-circuit current are improved.

In addition, it may be understood that the solar cell in the present disclosure and the preparation method thereof may be reproduced, and can be used in multiple industrial applications. For example, the solar cell in the present disclosure and the preparation method thereof may be used in the field of photovoltaic technologies.

What is claimed is:

1. A method for preparing a solar cell, comprising:

forming a selective emitter on a front side of the solar cell, wherein the selective emitter comprises a first doped region and a second doped region, and a P-type doping concentration of the first doped region is greater than a P-type doping concentration of the second doped region; and bringing a positive electrode of the solar cell to be in electrical contact with the first doped region, wherein a step of forming the selective emitter on the front side of the solar cell comprises:

providing an N-type silicon wafer having a P-N junction;

printing a boron slurry on an entire front side of the silicon wafer, selecting a part of the entire front side of the silicon wafer as a preset area of the front side of the silicon wafer; and pushing the boron slurry from the preset area of the front side of the silicon wafer to a P-type doping area of the front side of the silicon wafer to form the first doped region, and taking a remaining part of the P-type doping area as the second doped region.

2. The method of claim 1, wherein the preset area on the front side of the silicon wafer is configured for forming the positive electrode.

3. The method of claim 1, wherein a mass concentration of the boron slurry is in a range of 2.5% to 7%.

4. The method of claim 1, wherein a step of forming the selective emitter on the front side of the solar cell further comprises:

before printing the boron slurry on the front side of the silicon wafer, removing a boron-silicon glass on the front side of the silicon wafer.

5. The method of claim 4, wherein a step of forming the first doped region further comprises pushing the boron slurry by a laser, wherein, a laser power is in a range of 20 W to 40 W, a percentage of an output power of laser is in a range of 70% to 90%, a laser scanning speed is in a range of 20 m/s to 30 m/s, and the number of a laser scanning times is in a range of 2 to 4.

6. The method of claim 5, wherein the step of forming the first doped region further comprises pushing the boron slurry by the laser, which is emitted by a nanosecond laser device.

7. The method of claim 4, wherein the step of forming the selective emitter on the front side of the solar cell further comprises: forming another boron-silicon glass on the front side of the silicon wafer again after forming the first doped region; and wherein, a process of forming the another boron-silicon glass comprises: first depositing a silicon oxide layer with a thickness in a range of 50 nm to 100 nm, and then heating for 30 min to 60 min at a temperature of 900° C. to 1300° C.

8. The method of claim 1, wherein after a step of forming the selective emitter on the front side of the solar cell, the method further comprises the following steps in sequence:

removing a boron-silicon glass on the back side of the silicon wafer, the P-N junction on a back side and an edge of the silicon wafer, and remaining boron slurry on the front side of the silicon wafer;

disposing a doped oxide layer and an amorphous silicon passivation film on the back side of the silicon wafer;

annealing to make a crystal structure of the amorphous silicon passivation film change to form a polycrystalline silicon thin film;

removing an oxide layer on the front side of the silicon wafer formed in a process of disposing the doped oxide layer and an oxide layer formed in a process of annealing, and removing amorphous silicon on the front side of the silicon wafer formed in a process of disposing the amorphous silicon passivation film;

forming a front passivation film and a front reflection reducing film on the front side of the silicon wafer, and forming a back hydrogen passivation film on the back side of the silicon wafer; and forming electrodes.

9. The method of claim 1, wherein the first doped region is a heavy doped region, and the second doped region is a light doped region.

10. The method of claim 1, further comprising a step of preparing a functional structure, wherein the functional structure is at least one of an anti-reflection textured structure, a P-N junction, a tunneling oxide layer, a polycrystalline silicon film, a front anti-reflection film, or a back hydrogen passivation film.

* * * * *